United States Patent [19]

McLevige et al.

[11] Patent Number: 4,654,960
[45] Date of Patent: Apr. 7, 1987

[54] METHOD FOR FABRICATING GAAS BIPOLAR INTEGRATED CIRCUIT DEVICES

[75] Inventors: William V. McLevige, Plano; Han-Tzong Yuan, Dallas; Walter M. Duncan, Dallas; Friedrich H. Doerbeck, Dallas, all of Tex.

[73] Assignee: Texas Instruments Incorporated, Dallas, Tex.

[21] Appl. No.: 808,901

[22] Filed: Dec. 13, 1985

Related U.S. Application Data

[63] Continuation of Ser. No. 317,367, Nov. 2, 1981, Pat. No. 4,573,064.

[51] Int. Cl.⁴ .................. H01L 21/265; H01L 29/48
[52] U.S. Cl. ........................... 29/576 B; 29/576 W; 148/1.5; 148/175; 148/187; 148/DIG. 84; 357/16; 357/34; 357/91
[58] Field of Search ............... 29/576 B, 576 W; 148/175, 1.5, 187; 357/16, 34, 91

[56] References Cited

U.S. PATENT DOCUMENTS

| | | | |
|---|---|---|---|
| 3,897,273 | 7/1975 | Marsh et al. | 148/1.5 |
| 4,378,255 | 3/1983 | Holonyak, Jr. et al. | 148/1.5 |
| 4,380,774 | 4/1983 | Yoder | 357/16 |
| 4,400,221 | 8/1983 | Rahilly | 148/1.5 |
| 4,403,397 | 9/1983 | Bottka et al. | 29/572 |
| 4,484,207 | 11/1984 | Nishizawa et al. | 357/16 |

OTHER PUBLICATIONS

Yaun et al. Electronics Letts. 16, Jul. 1980, p. 637.

*Primary Examiner*—Upendra Roy
*Attorney, Agent, or Firm*—Carlton H. Hoel; James T. Comfort; Melvin Sharp

[57] ABSTRACT

Bipolar transistors and other electronic structures are fabricated on a gallium arsenide (GaAs) substrate to form an integrated circuit device. This process is made possible by development of an ion implant technique which uses an acceptor material to create a P type region, boron or protons to create insulating regions, and silicon or selenium to create an N type region. The process avoids the difficult problems encountered in diffusion methods, and, due to the precise control available with the ion implant method, makes possible the fabrication of IC quality transistors consistently over a substrate. This same control enables the fabrication of integrated circuits with improved device packing density and reduced parasitic parameters.

15 Claims, 8 Drawing Figures

METHOD FOR FABRICATING GAAS BIPOLAR INTEGRATED CIRCUIT DEVICES

This is a continuation of application Ser. No. 317,367, filed Nov. 2, 1981, now U.S. Pat. No. 4,573,064.

BACKGROUND OF THE INVENTION

This invention relates to fabrication of a bipolar integrated circuit, and more specifically to fabrication of a bipolar integrated circuit on a gallium arsenide substrate.

GaAs MESFET devices have been quite successful in applications such as microwave and high speed digital circuits. This success of GaAs MESFETs has been due mainly to high electron mobility of GaAs and existence of semi-insulating GaAs substrates. Even in view of these successes, and a long period of development, the application of GaAs MESFETs to anything more than MSI logic in digital circuitry has not come about. Some of the reasons for this are: difficult circuit modeling and design, poor threshold voltage control, and sensitivity of MESFET operation to load conditions.

Silicon bipolar technology is well known for its advantages in terms of uniform threshold, noise immunity, and circuit design ease, which make it well suited for custom LSI such as gate arrays. However, the GaAs bipolar transistor has received little attention, due in great part to poor results obtained in the early period of research on GaAs devices. These poor results were generally caused by problems with diffusion techniques that were not accurate enough to control required device characteristics. The main problem encountered with the diffusion techniques is that dopant profiles could not be adequately established in a material using diffusion. Dopant concentrations tend to fall off with depth, and the concentration at a given depth is not accurately predictable.

The difficulty with the diffusion techniques was caused by inadequate control of the doping profile of the base region. In the prior art, a zinc or magnesium diffusion would be used to form a P-type base region, but adequate control of the doping profile was not practicable. Implantation avoids this problem, since the doping profile can be controlled to be more even within the base region, as will be further discussed below. For background, see Glaser and Subak-Sharpe, Integrated Circuit Engineering 1977, which is hereby incorporated by reference.

However, recent success of ion-implantation compared to earlier diffusion techniques means that critical junction depths and doping concentrations, which significantly affect bipolar IC design and performance, can now be precisely controlled. Some problems will remain with the GaAs bipolar device, such as low hole mobility and low maximum donor concentration, but novel design of devices and circuitry should make possible the full utilization of GaAs bipolar technology potential for high-speed digital applications.

SUMMARY OF THE INVENTION

The purpose of the present invention is to combine the advantage of silicon bipolar technology with the speed of gallium arsenide to provide a high speed, high density digital IC. Implementation of bipolar technology on a GaAs substrate using a modified form of I²L logic and a novel method of fabrication make this combination possible and practical.

The process of the present invention has novel features which are decidedly advantageous over previous work done in this area. First, the use of bipolar technology to fabricate devices on a GaAs substrate makes possible high speed digital logic applications. Also, the novel modification of I²L logic to adapt it for use on GaAs combines the low power consumption and high packing density of I²L with the speed of bipolar GaAs devices. Additionally, ion implant processing, rather than diffusion, gives the accuracy required for precise junction depths and dopant concentrations. Also, because design coupling of I²L logic gates is well known in the art, as is the process for interconnection on a chip, gate array design may be reserved for an end user by fabricating a large number of basic logic gates on a chip so that design is a matter of interconnection. In this manner, typical and/or special circuit functions may be produced by addition of one or two metal levels to a chip.

In one aspect of the invention, the preferred embodiment provides a method of fabrication for novel I²L-like bipolar integrated circuits on a GaAs substrate. The concept for these circuits was disclosed by H. T. Yuan in co-pending U.S. patent application Ser. No. 317,366 filed Nov. 2, 1981, hereby incorporated by reference. The design of the circuits makes use of inverted (substrate emitter) transistors similar in configuration to that of I²L, but having an ion-implanted velocity-saturated load resistance in place of the lateral P-N-P transistor of the I²L design. The method begins with GaAs epitaxial layers grown on a GaAs substrate by either vapor-phase epitaxy (VPE), molecular-beam epitaxy (MBE), or metal-organic chemical vapor deposition (MOCVD). The doping of the collector and base regions is done either by ion-implantation or incorporated during the epitaxial growth. Device isolation is accomplished by patterned boron implantation, which selectively converts the GaAs into a semi-insulating material while maintaining a planar surface for subsequent processing.

In another aspect of the invention, the epitaxial layers consist of GaAs and AlGaAs. The addition of the wide band-gap AlGaAs to form the emitter region enhances the performance of the device, as emitter injection efficiency is improved and a higher current gain is realized.

DETAILED DESCRIPTION OF THE DRAWINGS

Figure 1:
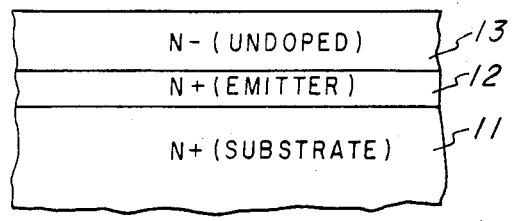
FIG. 1 is a cross-section view of the substrate material with epitaxial layers in place over the substrate.

As shown in FIG. 1, one embodiment of the fabrication process of the present invention begins with a structure having a substrate wafer of gallium arsenide (GaAs) 11 approximately 15 mils thick. This substrate material is doped with an appropriate donor material to make the substrate heavily N-doped. This is accomplished by doping with, for example, tellurium, or silicon at a level of $10^{18}$ per $cm^3$ or greater. Next, a layer 12 of GaAs having a thickness of approximately 1.6 um is grown by, for example, vapor phase epitaxy (VPE), over the substrate material. This layer is doped with a donor material, for example, sulfur, to a level of approximately $10^{18}$ $cm^{-3}$, making the layer highly N type. The final layer of the structure is a layer of GaAs 13 of approximately 0.8 um thickness, which is undoped. Donor concentration in the undoped GaAs is approximately $10^{15}$ $cm^{-3}$ due to remnant impurities.

The first N+ epitaxial layer is not electronically necessary, but is provided due to the normal crystalline properties of easily available gallium arsenide substrate. That is, if a doped gallium arsenide substrate having a satisfactorily low defect level could be provided, the N+ substrate could itself be used as the emitter. In this alternative embodiment, only a single (undoped) epitaxial layer is grown, and the base and collector are then formed by subsequent implants as described below. In the preferred embodiment, the N+ epitaxial layer for the emitter is grown because this provides better physical characteristics at the emitter/base junction. Thus, the first N+ epitaxial layer is provided for physical rather than electronic reasons.

Figure 2:
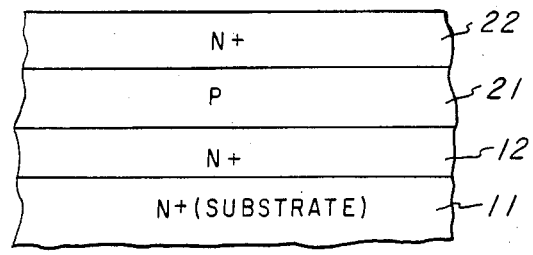
FIG. 2 is a cross-section view of the structure after implants in the collector and base regions.
Figures 7, 8:
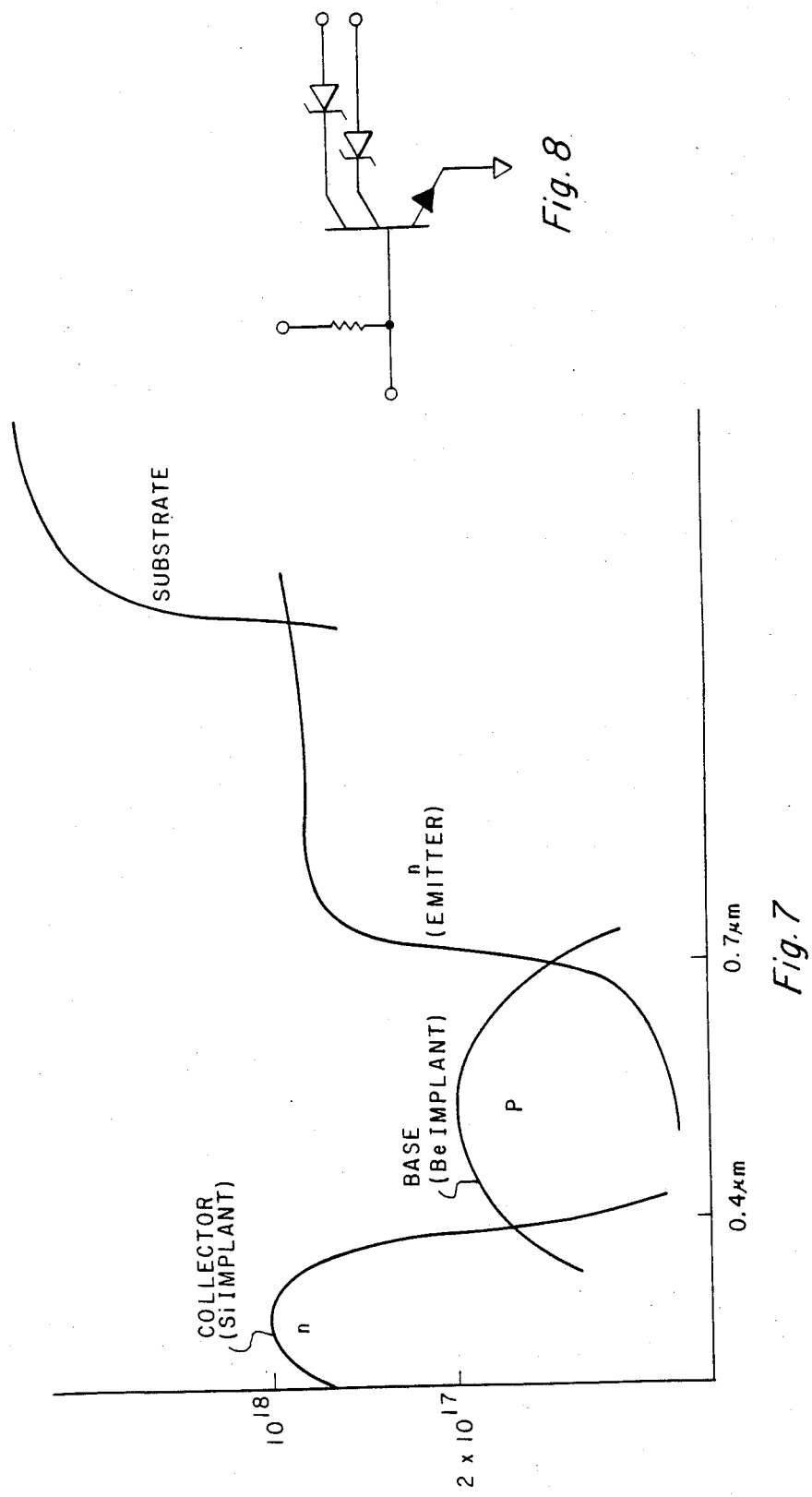
FIG. 7 is a graph showing the dopant profile of the transistor device in the structure of FIG. 6.
FIG. 8 is a schematic diagram of the structure of FIG. 6.

Processing of the structure continues with a first implant of, for example, a $1.5 \times 10^{13}$ $cm^{-2}$ dose of, for example, silicon or selenium at 80 keV. Next, a second implant is made, for example, of a $3 \times 10^{13}$ $cm^{-2}$ dose of silicon at 180 keV. The reason for implanting more than one time is to obtain a more even dopant profile. The more flat the profile curve, the more consistent the dopant throughout the doped region, and more efficient and reliable device. As shown in FIG. 2, this converts the upper layer of GaAs 22 to heavily doped N-type, to form the collector of the inverted transistor. In implantation processes, the dosages indicated are surface incidence dosages, and are measured in $cm^{-2}$ (inverse square centimeters). The epitaxial layers are grown from materials having a dopant concentration growth which is measured in $cm^{-3}$ (inverse cubic centimeters). In order to calculate the dopant level per $cm^3$ of a location after an implant, reference can be made to the appropriate tables in Projected Range Statistics, Semiconductors and Related Materials; J. F. Gibbons, W. J S. Johnson, and S. W. Mylroie, Dowden, Hutchinson, and Ross, Inc., Stroudsburg, Pa., 1975. The structure is then annealed at 850° C. in an arsenic overpressure atmosphere for 15 minutes. The arsenic overpressure atmosphere is composed of a hydrogen carrier gas at 1 atmosphere and a partial pressure of arsenic vapor between $10^{-1}$ and $10^{-7}$ atmospheres. The structure is now implanted with, for example, $8 \times 10^{-12}$ $cm^{-2}$ of Be at 180 keV to form the base region. (Alternately Mg, Cd, or Zn may be implanted). FIG. 2 shows the result of the implant, which is to create a P type region in the lower portion of the undoped N epitaxial layer 13. The structure is again annealed in an arsenic overpressure atmosphere at 850° C. for 15 minutes. The implant profile of the transistor structure now is as shown in the graph of FIG. 7. The collector designation in FIG. 7 is made referring to an I²L, or inverted transistor, structure. The two separate anneals of 850° C. for 15 minutes for the collector and base implants, as described above are not necessary or desirable in all cases. The separate base implant anneal minimizes the diffusion of implanted beryllium if the collector implant damage is excessive, but also allows an increased amount of out diffusion of dopants from the underlying emitter region into the base.

Figure 3:
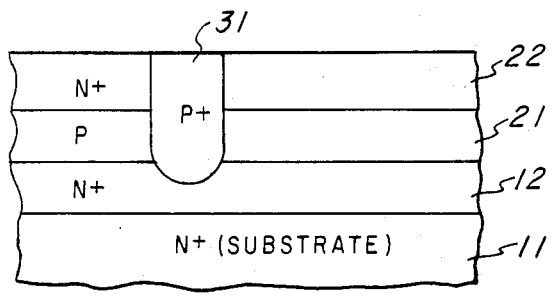
FIG. 3 is a cross-sectional view of the structure after an implant which provides the base contact region for the logic gate.

Referring now to FIG. 3, a patterned implant is made in two steps to form a P+ region 31 from the surface of the structure down into the emitter to contact the base region. In the first step, $2 \times 10^{14}$ $cm^{-2}$ of, for example, Be is implanted at 40 KeV. Then, the same material is implanted again, $3 \times 10^{14}$ $cm^{-2}$ at 80 keV. The two implants here serve a dual purpose. First, the implant profile is evened out somewhat, and secondly, a low surface resistance is provided so that the ohmic contact to the base region will be low resistance. The structure is then annealed at 700° C. for 30 minutes. This low temperature anneal is used here to prevent diffusion, and to maintain a high acceptor concentration (8 to $10 \times 10^{18}$ $cm^{-3}$) to over-compensate the collector doping shown in FIG. 7 (implant profile).

Figure 4:
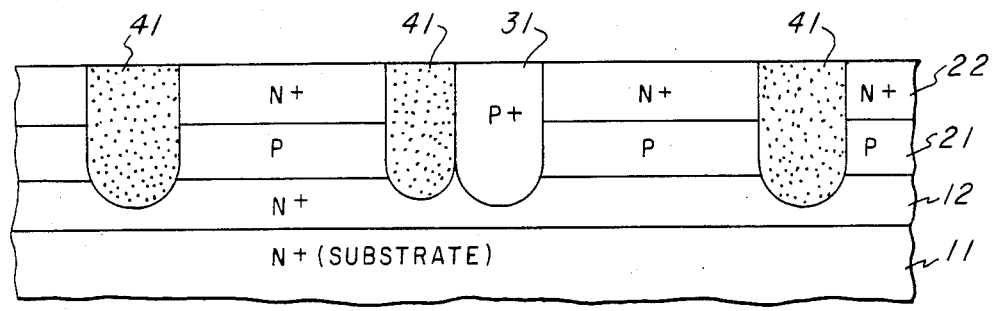
FIG. 4 is a cross-section view of the structure after an implant to create device isolation areas.

Now, as shown in FIG. 4, an implant step is used to create isolation regions 41 to insulate devices on the structure from each other. The implant step is done in three parts. The first part is a boron implant of $2 \times 10^{12}$ $cm^{-2}$ at 50 keV. The second part is an implant of $4 \times 10^{12}$ $cm^{-2}$ of boron at 140 keV. The final implant is $6 \times 10^{12}$ $cm^{-2}$ of boron at 320 keV. These implants create isolation regions by damaging the GaAs material to the point that it becomes a semi-insulator. This effectively isolates each device on the structure and provides a planar surface for subsequent processing. This implant serves to create isolation, because the lattice damage created is such that the resistivity of the material is raised to a very high level. To successively accomplish this technique of isolation implanting, there are four conditions which must be met: (1) The implanted species should preferably be a light ion, so that the implantation can reach to the depths required. (2) The species implanted should preferably be a non-doping species. In gallium arsenide, hydrogen, oxygen and boron are suitable for this. (3) The dosages used should be sufficient to damage the lattice everywhere within the desired isolation region, to the point where a high resistivity is achieved. To accomplish this, multiple implants may be used, as in the presently preferred embodiment just discussed. (4) Subsequent high-temperature steps should be avoided, to prevent annealing of the lattice, and lowering the resistivity by healing of the lattice damage. In the presently preferred embodiment, steps above 600° C. are avoided after the isolation implant. Some higher-temperature processing could be performed, since the degree of isolation presently achieved is more than sufficient. Thus, in addition to providing a planar surface above the isolation regions, compact isolation is achieved with minimal waste of real estate. A major advantage which this method of isolation provides is that oversize contacts can be used, i.e., contact metalliation can run right over isolation regions (and hence as a first level of interconnects), and no step coverage problem occurs since the isolation regions are themselves planar.

The resulting dopant levels in the implanted regions, and the thickness of these layers for the homojunction transistor should be within the following values:

In the emitter region, from $2 \times 10^{17}$ to $2 \times 10^{18}$ $cm^{-3}$ (thickness of 2–10 um (N type) (N); in the base region, from $5 \times 10^{16}$ to $5 \times 10^{17}$ $cm^{-3}$ with a thickness of 0.1 to 0.6 um (P type) and in the collector region, from $5\times10^{16}$ to $5\times10^{18}$ cm$^{-3}$ (N type) with a thickness of 0.2 to 0.6 um. Particularly, the doping level of the emitter should be at least 5 times greater than the dopant level of the base, and preferably more than 10 times greater.

Figure 5:
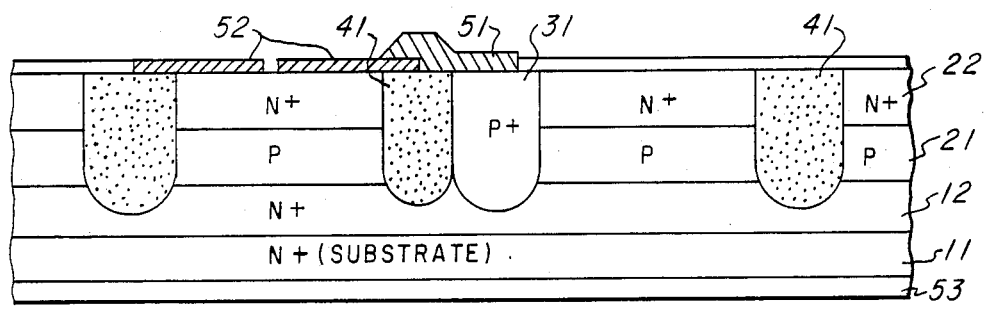
FIG. 5 is a cross-section view of the structure after contact material has been deposited.

FIG. 5 shows the structure after having ohmic contact 51 deposited on the surface of the structure by methods well known to those skilled in the art. A layer of silicon nitride is deposited on the GaAs surface before the photo-resist pattern is applied and developed, so that silicon-nitride assisted lift-off can be accomplished. This step assures a sharp definition of the ohmic contact shapes. After the contacts are deposited, the silicon nitride is removed. The P type ohmic contact 51 is, for example, a silver/manganese alloy having a thickness of approximately 2000 A. The alloy ratio of the metal is approximately 92% silver, 8% manganese. Other possible choice for the P-type ohmic contact is a gold/zinc alloy (96% gold/4% zinc). N type ohmic contacts 52 are a gold/germanium alloy, (88% gold, 12% germanium) covered by nickel, having a total thickness of 1500 A. The nickel thickness should be about 25% of the thickness sof the gold/germanium. The same metal compound is evaporated all over the back side of the substrate to form the substrate/emitter contact 53. The structure is then subjected to a temperature of 430° C. for 1 minute to alloy the ohmic contacts.

The N type ohmic contacts 52 define by their geometric relationship the velocity saturation load for current injection to the base of the logic gate. The distance between these contact regions determines the turn-on voltage i.e., voltage to attain saturation current. This distance may be approximately 1 um. For cases where the turn-on voltage may be high enough to cause "punchthrough" of the relatively thin base layer (0.1-0.6 um) to the emitter layer, an added P type implant in the area underneath the velocity saturation load in the base region to increase the dopant concentration to $10^{18}$-$10^{19}$ may be necessary for reliable operation.

In the presently preferred embodiment, a drift space of two microns between the two ohmic contacts is used for velocity-saturated load. With these dimensions, a turn-on voltage of about 1½ volts is attained. In addition, by regulating the width of the region across which drift between the ohmic contacts occurs, the current provided at saturation can be independently regulated. In particularly, the current limited by the velocity-saturated load can be fine-tuned at a very late stage of fabrication, by a damaging implant, e.g., boron, as discussed above, which is applied to a portion of the drift space between the ohmic contacts. Thus, the dimensions of the velocity-saturated load are regulated, first, so that punch through to the emitter region does not occur, second, to select the volts per centimeter within the drift region in accordance with the desired operating voltage of the circuit, and third, to regulate the current at saturation. Thus, the following advantages are provided by the velocity-saturated load: (1) No added process complexity is introduced. (2) Turn-on of the load element occurs at a very low voltage, since adjustment of the dimensions of the velocity-saturated load can easily be performed to regulate the turn-on voltage to approximately one volt. This compares very favorably with polysilicon load resistors, or MOS depletion loads, although it is not as good as that attained with PNP transistors. (3) The characteristics of the load are relatively insensitive to process parameters. (4) The characteristics of the load can be fine-tuned if necessary at a very late stage of processing. (5) Perhaps the most important advantage of the the velocity-saturated load is that an exceedingly small load element is attained, so that an extremely high packing density may be achieved. The advantages of a velocity-saturated load in gallium arsenide, using spaced contacts as described above, may also be applied to other families of current-mode logic in gallium arsenide.

Figure 6:
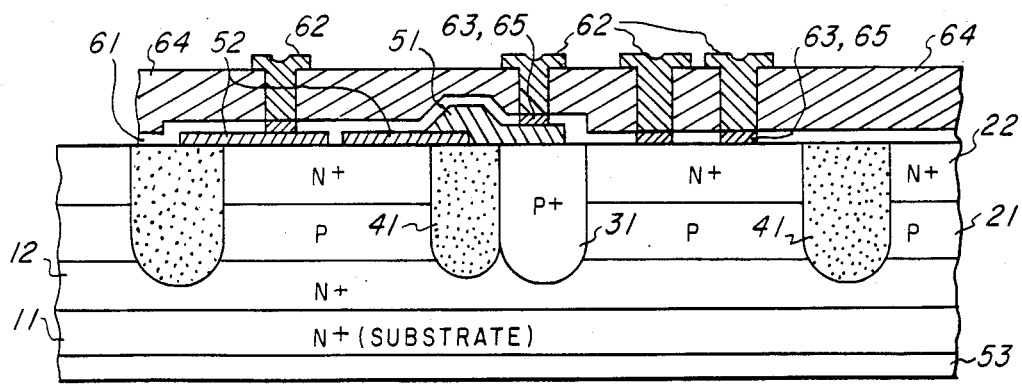
FIG. 6 is a cross-section view of the completed gate structure.

In the presently preferred best mode of practicing the invention, the final step has two parts. First, as shown in FIG. 6, a layer of insulating material 61, for example, silicon nitride, is grown over all the top surface to a thickness of approximately 800 A. Next, a layer of polyimide 64 is deposited over the silicon nitride to a thickness of 0.7 to 1.5 um. These layers passivate the surface and insulate the metal interconnects from the device. Windows are then etched through the polyimide and silicon nitride to the contacts and the device surface. The second part of the step deposits a 1000 A layer of Titanium 63 on the uncovered surface of ohmic contacts, an intermediate layer of 500 A of platinum 65, then a 6000 A layer of gold 62 over the platinum. The deposition of the interconnect titanium/platinum/gold layer over the insulator minimizes the bonding pad capacitance. In addition to forming the interconnect function, the titanium/platinum/gold serves as the Schottky metal for the Schottky-barrier fan out isolation diodes.

The provision of fan out isolation diodes provides major advantages. First, such Schottky-barrier fan out isolation dioes have approximately a 4:1 area advantage over junction fan out isolation. Second, the provision of the fan out isolation diodes directly on top of the collector layer in the present invention means that there is no significant voltage drop limitation in adding a large number of fan out isolation diodes, since all fan out isolation diodes are separated from the emitter only by the thickness of the base and collector layers. Second, provision of Schottky-barrier fan out isolation diodes according to the present invention does not add significant processing complexity, since these diodes are (in effect) self-aligned structures. Thus, in the present invention, the fan out is limited only by the current gain of the switcing transistor. This is a particular advantage in the heterojunction embodiment, since the very large gain possible in the transistor of that embodiment (as will be described below) permits huge fan out capability, comparable to that of MOS. The characteristics of the velocity-saturated load element do not limit fan out, since the saturation current of that load element can be selected to be as large as desired, merely by increasing the width of the drift space, as discussed above. While Schottky-barrier diodes are used for fan out isolation in STL, STL fan out is limited by the voltage drop which occurs across the lateral collector structure. This voltage drop means that the required noise margin limits available fan out. Alternatively, junction-diode fan out isolation could be used, although this is not the preferred embodiment of the invention.

FIG. 8 shows a schematic diagram of the basic logic gate of the present invention. Note that Schottky fan out isolation diodes are shown, according to the presently preferred embodiment.

A schematic diagram of the basic logic gate of the fabrication process disclosed is shown in FIG. 8.

The present invention has heretofore been described with reference to an embodiment using homojunctions.

However, significant further advantages are attained using a heterojunction structure. Although at present, the heterojunction structure is much less economical to fabricate, the performance advantages have now been verified, and both homojunction and heterojunction embodiments are within the scope of the present invention.

In a preferred embodiment of the present invention, there is provided a heterojunction structure upon which devices are fabricated. The substrate of this structure is identical to the substrate of the homojunction structure. The layers over the substrate are grown either by the molecular-beam epitaxy method or the metal-organic chemical vapor deposition method.

In the heterojunction embodiment, an $Al_xGa_{1-x}As$ emitter is used with X preferably in the range of 0.05 to 0.10, although larger percentages of aluminum could also be used. Processing difficulty has increased significantly as a larger percentage of aluminum is introduced into an AlGlAs alloy, and the advantages of the present invention are adequately attained by use of a 10% substitution of aluminum. A 10% substitution of aluminum causes a 100 meV increase in the bandgap, but this small increase is sufficient to radically improve device performance. This is because kT/q for such gallium arsenide structures is typically 25 meV. Thus, the 100 meV of increased bandgap causes a unilateral injection preference of approximately $e^4$ (approximately 100). This causes a significant increase in the emitter efficiency, and thus a much higher gain through the transistor is achieved. If a higher percentage of aluminum is used, no further effective improvement in gain is realized, and other effects (which may be adverse) begin to dominate. The doping levels used in the heterojunction embodiment are also changed, since the emitter and base doping levels are now preferably approximately equal. Since the bandgap difference provides injection efficiency at the emitter/base/junction, the heavier doping normally used for the emitter is not required. In fact, too heavy emitter doping levels produce a decreased effective bandgap, so that reduced gain is produced by excessive emitter doping of the heterojunction device.

The first layer is preferably an N+ GaAs buffer layer having a thickness of (e.g.) 0.2 um doped at the same level as the substrate. At this point, an additional layer is introduced. This layer is an AlGaAs layer with a composition of 5-50% Al, approximately 2 um thick. This wide band-gap material significantly increases the current gain of the devices fabricated on this structure. As in the alternative embodiment, the upper layer is N type lightly doped GaAs 0.8 um thick. The processing of this beginning material is identical to that to of the previously described structure. The resulting dopant levels, and the thickness of the levels, of the heterojunction device are as follows:

in the AlGaAs emitter region $1 \times 10^{16}$ to $5 \times 10^{18}$ cm$^{-3}$ with a thickness of 0.2 to 5 um (N type), in the base region, $5 \times 10^{16}$ to $1 \times 10^{19}$ cm$^{-3}$ with a thickness of 0.1 to 0.6 um (P type); in the collector region, $5 \times 10^{16}$ to $5 \times 10^{18}$ cm$^{-3}$ with a thickness of 0.2 to 1 um (N type). In this embodiment, the emitter-base doping ratio is less critical. This is an advantage, as doping levels can then be optimized so that the base sheet resistance can be minimized, along with the emitter junction capacitance, because the current gain of the heterojunction device is relatively insensitive to the emitter-base doping ratio.

After fabrication of inverted transistor (buried emitter) test devices, the tests have shown that heterojunction devices of this type typically have a current gain of approximately 100, while the current gain of the homojunction devices of this type is between 2 and 7, typically.

The method of fabrication as disclosed in the present invention is a significant advance in the art of high speed digital circuitry fabrication. The use of GaAs provides a basic advantage over other semiconductors, in that its characteristics allow for a great improvement in speed. Gate delays of 0.5 ns are well within reason. Additionally, the implementation of a novel modified I$^2$L technology in bipolar devices represents advantages such as noise immunity, circuit design ease, and high packing density.

Fabrication of bipolar high speed digital circuits on GaAs is a novel combination of materials and processes to produce an integrated circut that is more dense, faster, and easier to use than other types of these circuits.

What is claimed is:

1. A method for fabricating a GaAs bipolar integrated circuit structure, comprising the steps of:
   growing an intermediate layer of N+ GaAs;
   growing a top layer of lightly doped N− GaAs;
   ion implanting said top layer of GaAs to convert surface of said layer to N+ type;
   annealing the resulting structure;
   ion implanting said top layer to convert bottom of said layer to P type;
   annealing the resulting structure;
   ion-implanting said structure in selected areas to create semi-insulating areas in said structure for device isolation;
   depositing ohmic material on selected surface areas for device contacts;
   growing an insulating layer on said structure surface for surface passivation and etching windows for ohmic contacts in selected surface areas; and
   depositing a patterned metallic layer for interconnection between device contacts.

2. A method as in claim 1, wherein said conversion of surface N− layer to N+ is accomplished by said ion implantation of silicon.

3. A method as in claim 1, wherein said conversion of bottom of said N− top layer to P types is accomplished by ion implantation of an element selected from the group consisting of Be, Mg, Cd, or Zn.

4. A method as in claim 1, wherein said creating a P+ region extending from the surface through each said layer and into said substrate layer is accomplished by ion implantation of beryllium.

5. A method as in claim 1, wherein said creating semi-insulating areas is accomplished by said ion implantation of boron.

6. A method as in claim 1, wherein said ohmic material is a gold-zinc alloy for deposition on P+ regions.

7. A method as in claim 1, wherein said ohmic material is a gold-germanium nickel alloy for deposition on N+ regions.

8. A method as in claim 1, wherein said insulating layer for surface passivation is comprised of silicon nitride.

9. A method as in claim 1 wherein said patterned layer is comprised of an alloy of titanium, platinum and gold.

10. A method as in claim 1 wherein all said layers of GaAs are prepared using the vapor phase method deposition.

11. A method as in claim 1, having an added step directly after said step of growing an intermediate layer of N+ GaAs, comprising:
grow a second intermediate layer of N type AlGaAs.

12. A method as in claim 11, wherein all of said layers are prepared using molecular beam epitaxy.

13. A method as in claim 11, wherein all said layers are prepared using a metal-organic chemical vapor deposition method.

14. A method of fabricating a heterojunction bipolar integrated circuit structure, comprising the steps of:
(a) forming a layer of second-III-V compound semiconductor material on a layer of first-III-V compound semiconductor material, said first and second materials lattice matched, and the bandgap of said first material larger than the bandgap of said second material, and said first material doped a first conductivity type;
(b) ion implanting said second material to form a first sublayer abutting said first material and doped a conductivity type opposite said first type and a second sublayer abutting said first sublayer and doped said first conductivity type;
(c) ion implanting said second material to form a contact region of said opposite conductivity type through said second sublayer;
(d) ion implanting said second material to form an isolation region of semi-insulating material through said second material;
(e) whereby a heterojunction bipolar transistor is formed with said first material as an emitter, said first sublayer as a base, said second sublayer as a collector, said contact region as a contact to said base, and said isolation region as isolation of the transistor.

15. The method of claim 14, wherein:
(a) said first material is $Al_xGa_{1-x}As$ and second material is GaAs; and
(b) said isolation region is lattice-damaged material.

* * * * *